United States Patent
Iwaki

(10) Patent No.: US 9,148,106 B2
(45) Date of Patent: Sep. 29, 2015

(54) ACOUSTIC WAVE DEVICE

(71) Applicant: TAIYO YUDEN CO., LTD., Tokyo (JP)

(72) Inventor: Masafumi Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 208 days.

(21) Appl. No.: 13/907,661

(22) Filed: May 31, 2013

(65) Prior Publication Data

US 2013/0321102 A1      Dec. 5, 2013

(30) Foreign Application Priority Data

Jun. 4, 2012   (JP) ................. 2012-127034

(51) Int. Cl.
  *H03H 9/25*   (2006.01)
  *H03H 1/00*   (2006.01)
  *H03H 9/05*   (2006.01)
  *H03H 9/64*   (2006.01)

(52) U.S. Cl.
  CPC .............. *H03H 1/00* (2013.01); *H03H 9/0561* (2013.01); *H03H 9/0571* (2013.01); *H03H 9/0576* (2013.01)

(58) Field of Classification Search
  CPC ............ H03H 9/54; H03H 9/58; H03H 9/64; H03H 9/72; H03H 9/76
  USPC ......................................... 333/133, 187–195
  See application file for complete search history.

(56) References Cited

U.S. PATENT DOCUMENTS

| | | | |
|---|---|---|---|
| 6,756,864 B2 * | 6/2004 | Muramatsu ................... | 333/133 |
| 7,023,296 B2 * | 4/2006 | Uriu et al. ...................... | 333/132 |
| 7,548,135 B2 * | 6/2009 | Iwamoto et al. .............. | 333/133 |
| 7,619,491 B2 * | 11/2009 | Takata et al. .................. | 333/133 |
| 2010/0091752 A1 * | 4/2010 | Kemmochi et al. ........... | 370/339 |
| 2011/0110452 A1 * | 5/2011 | Fukamachi et al. .......... | 375/267 |

FOREIGN PATENT DOCUMENTS

| | | |
|---|---|---|
| JP | 9-98056 A | 4/1997 |
| JP | 2001-185420 A | 7/2001 |
| JP | 2010-10550 A | 1/2010 |
| JP | 2010-118828 A | 5/2010 |

* cited by examiner

*Primary Examiner* — Dean Takaoka

(74) *Attorney, Agent, or Firm* — Chen Yoshimura LLP

(57) ABSTRACT

An acoustic wave device includes: an acoustic wave filter chip that is mounted on a multilayered substrate including wiring layers; a first wiring that is electrically coupled to an internal circuit of the acoustic wave filter chip and formed in a first wiring layer of the multilayered substrate; a second wiring that is formed in a second wiring layer separate from the first wiring layer; and a via wiring that penetrates at least a part of the multilayered substrate and connects the first wiring to the second wiring; wherein the first wiring, the second wiring, and the via wiring forms a first inductor of which a direction of magnetic flux intersects with a stacking direction of the multilayered substrate.

9 Claims, 14 Drawing Sheets

ACOUSTIC WAVE DEVICE

CROSS-REFERENCE TO RELATED APPLICATION

This application is based upon and claims the benefit of priority of the prior Japanese Patent Application No. 2012-127034 filed on Jun. 4, 2012, the entire contents of which are incorporated herein by reference.

FIELD

A certain aspect of the present invention relates to an acoustic wave device.

BACKGROUND

As a filter for wireless devices including mobile phones, there has bee known acoustic wave devices including an acoustic wave filter that uses an acoustic wave such as a surface acoustic wave (SAW) or a bulk acoustic wave (BAW). A chip including an acoustic wave filter formed therein is flip-chip mounted on a surface of a multilayered substrate formed of, for example, ceramic by bumps, and is packaged by sealing a periphery thereof by resin. Wiring patterns electrically coupled to the acoustic wave filter chip are formed on a surface and an internal wiring layer of the multilayered substrate. These wiring patterns include, for example, an inductor constituting the acoustic wave filter. The wiring pattern of the inductor generally has a spiral line shape (see Japanese Patent Application Publication Nos. 2010-118828 and 2010-10550) or a Meander line shape (see Japanese Patent Application Publication No. 9-98056). Further, there has been known a technique to form a solenoid type inductor inside a semiconductor chip instead of inside the multilayered substrate (see Japanese Patent Application Publication No. 2001-185420).

The conventional inductor formed in the multilayered substrate of the acoustic wave device has a direction of magnetic flux that is the same as a stacking direction of the multilayered substrate and passes through an acoustic wave filter chip mounted on the surface of the multilayered substrate. Thereby, the acoustic wave filter is affected by the magnetic flux, and a filter characteristic degrades.

SUMMARY OF THE INVENTION

According to an aspect of the present invention, there is provided an acoustic wave device including: an acoustic wave filter chip that is mounted on a multilayered substrate including wiring layers; a first wiring that is electrically coupled to an internal circuit of the acoustic wave filter chip and formed in a first wiring layer of the multilayered substrate; a second wiring that is formed in a second wiring layer separate from the first wiring layer; and a via wiring that penetrates at least a part of the multilayered substrate and connects the first wiring to the second wiring; wherein the first wiring, the second wiring, and the via wiring forms a first inductor of which a direction of magnetic flux intersects with a stacking direction of the multilayered substrate.

DETAILED DESCRIPTION

A description will first be given of an acoustic wave device in accordance with a comparative example.

Figure 1A:
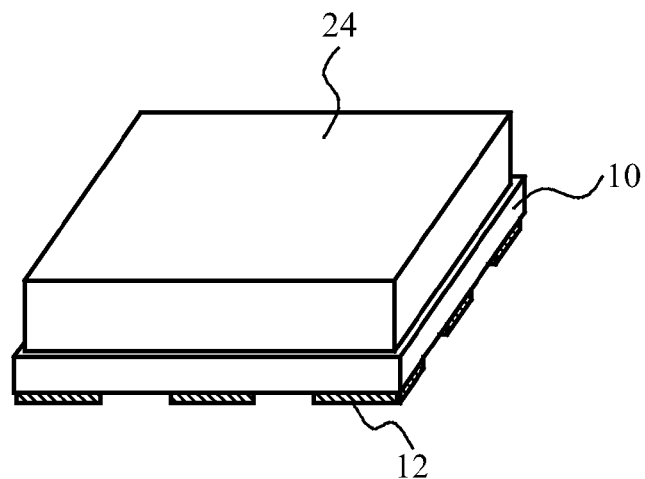
FIGS. 1A through 1C are external views of acoustic wave devices in accordance with first and second embodiments.
Figure 1B:
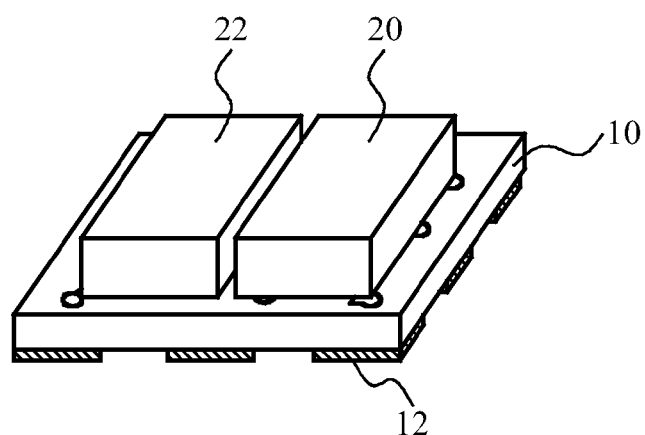
Figure 1C:
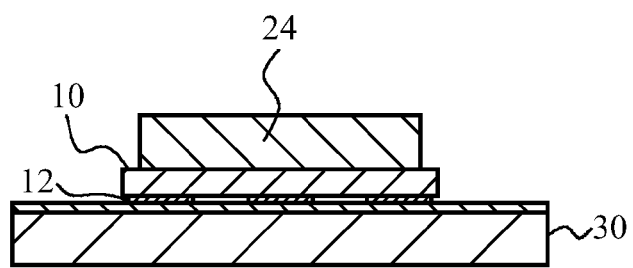

FIGS. 1A through 1C are external views illustrating a structure of acoustic wave devices in accordance with a comparative example and first and second embodiments. FIG. 1A is a perspective view of the acoustic wave device, and illustrates a state where a surface of a multilayered substrate is covered with resin. FIG. 1B is a diagram in which the resin is removed from FIG. 1A, and illustrates a state where filter chips are mounted on the surface of the multilayered substrate. FIG. 1C is a side view illustrating the multilayered substrate mounted on a large-size substrate.

As illustrated in FIG. 1B, on a front surface of a multilayered substrate 10, flip-chip mounted are a transmission filter chip 20 including a transmission filter and a reception filter chip 22 including a reception filter. As illustrated in FIG. 1A, resin 24 covers surfaces of the filter chips to protect them from a shock from an outside. Electrode pads 12 for external electrical connections are formed on a back surface of the multilayered substrate 10. As illustrated in FIG. 1C, the multilayered substrate 10 is mounted on a surface of a large-size substrate 30 through the electrode pads 12.

Figure 2A:
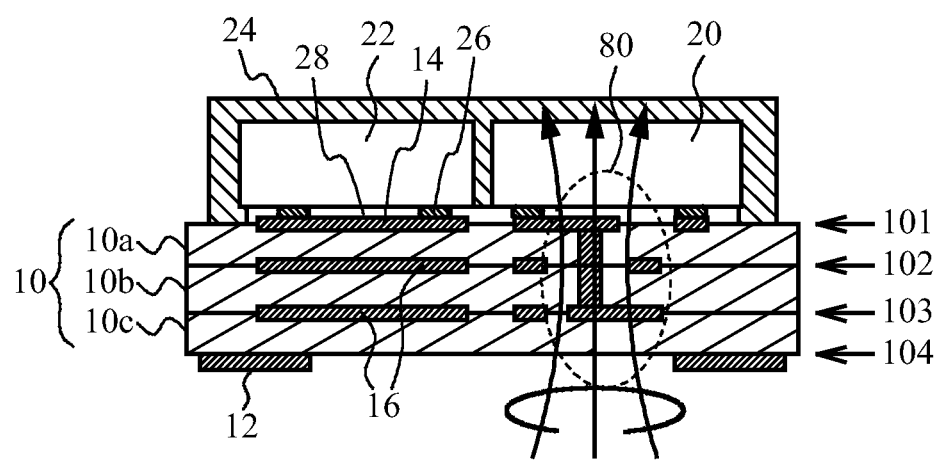
FIGS. 2A and 2B are diagrams illustrating a structure of an acoustic wave device in accordance with a comparative example.
Figure 2B:
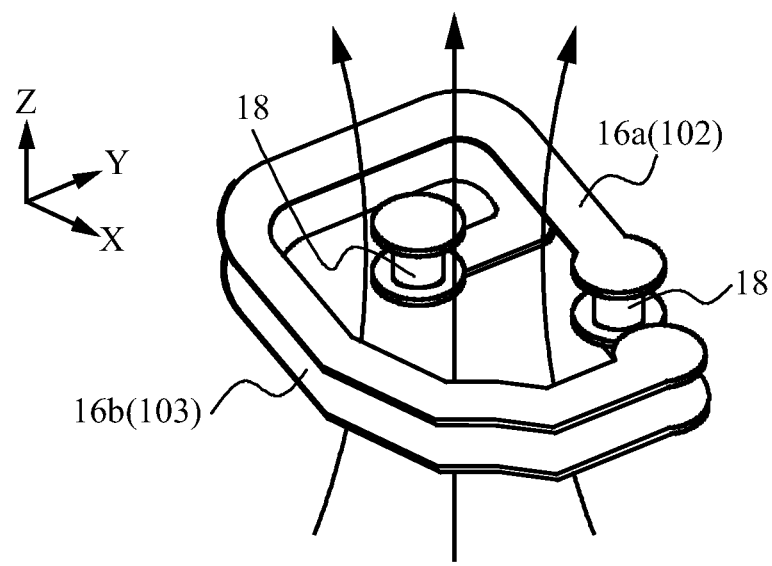

FIGS. 2A and 2B are diagrams illustrating a detailed structure of the acoustic wave device of the comparative example, FIG. 2A is a schematic cross-sectional view, and FIG. 2B is a schematic perspective view of an inductor part. As illustrated in FIG. 2A, the multilayered substrate 10 is formed by stacking substrates 10a through 10c. Wiring layers in which wiring patterns are formed are located on the front surface and back surface of the multilayered substrate 10, between the substrates 10a and 10b, and between the substrates 10b and 10c. In the following description, a surface on which filter chips (20, 22) are mounted is described as a wiring layer 101, a surface on which the electrode pads 12 are formed is described as a wiring layer 104, and intermediate layers are described as wiring layers 102 and 103. However, the number of substrates to be stacked and the number of wiring layers are not limited to the above configuration.

As illustrated in FIG. 2A, a surface wiring pattern 14 is formed in the wiring layer 101 that is the front surface of the multilayered substrate 10. The reception filter chip 22 and the transmission filter chip 20 are flip-chip mounted on the surface wiring pattern 14 through bumps 26. Upper surfaces and side surfaces of the reception filter chip 22 and the transmission filter chip 20 are covered with the resin 24, and surfaces at the multilayered substrate 10 side (bottom surfaces) are not covered with the resin 24. That is to say, the surfaces of the reception filter chip 22 and the transmission filter chip 20 are exposed to an air-space 28 formed between the chips and the multilayered substrate 10 by flip-chip mounting.

As illustrated in FIG. 2A, internal wiring patterns 16 are formed in the wiring layers 102 and 103 that are internal wiring layers of the multilayered substrate 10. The internal wiring patterns 16 are electrically coupled to the reception filter chip 22 and the transmission filter chip 20 through the surface wiring pattern 14 in the wiring layer 101, and also electrically coupled to the electrode pads 12 in the wiring layer 104. Parts of the internal wiring patterns 16 form an inductor 80 in the acoustic wave device of the comparative example. A direction of magnetic flux in the inductor 80 is along a stacking direction of the multilayered substrate 10, and passes through the transmission filter chip 20.

FIG. 2B is a schematic view of the inductor 80 formed by the internal wiring patterns 16. The inductor 80 includes a spiral-shaped wiring pattern 16a formed in the wiring layer 102 and a spiral-shaped wiring pattern 16b formed in the wiring layer 103, and both of them are connected to each other by via wirings 18 penetrating the multilayered substrate 10. Thereby, the wiring patterns 16a and 16b generates magnetic flux in a nearly vertical direction (Z-axis direction) with respect to the surface of the multilayered substrate 10 (XY plane), and enhance each other.

Figure 3A:
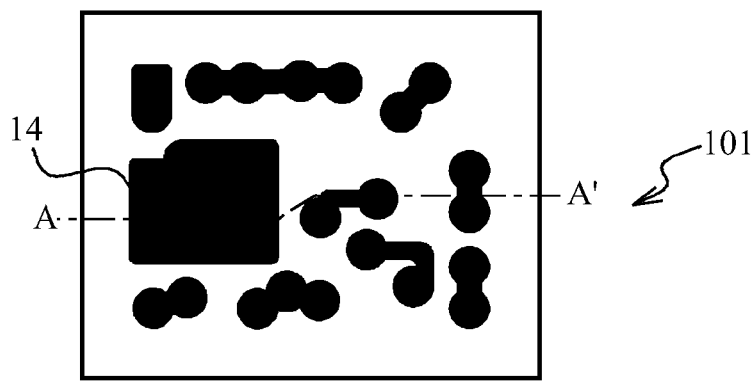
FIGS. 3A through 3D are plan views of wiring layers of the acoustic wave device in accordance with the comparative example.
Figure 3B:
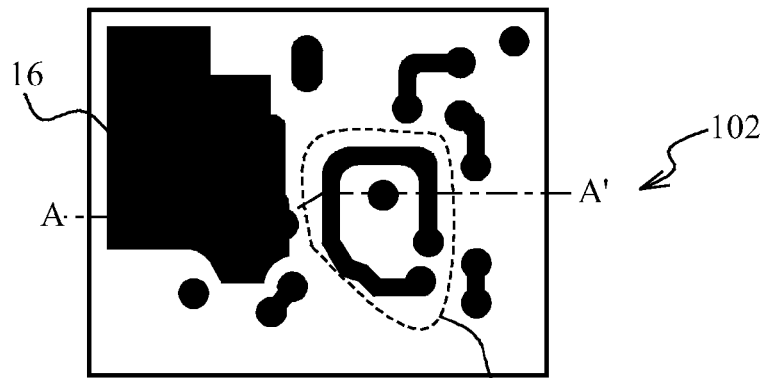
Figure 3C:
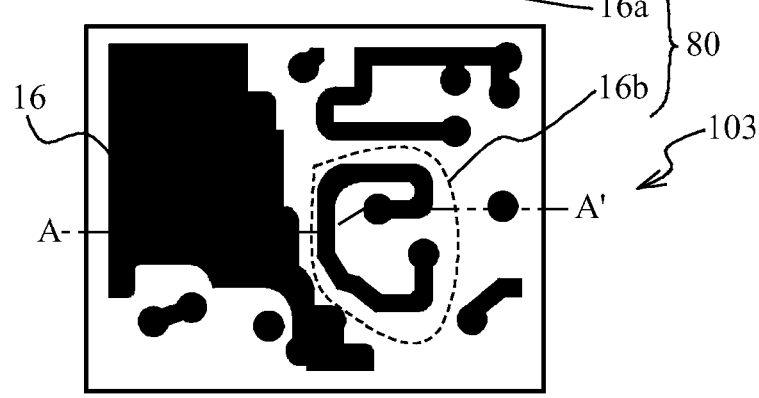
Figure 3D:
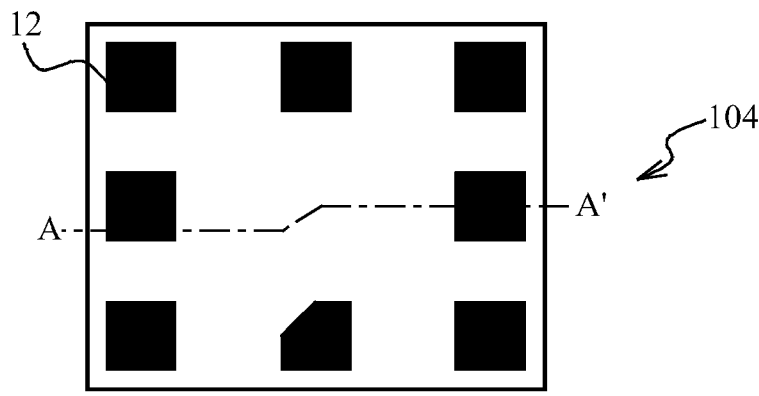

FIGS. 3A through 3D are plan views of wiring layers transparently illustrating the acoustic wave device of the comparative example from the upper surface side (side on which the filter chip is mounted) of the multilayered substrate 10. FIG. 3A is a plan view of the wiring layer 101, FIG. 3B is a plan view of the wiring layer 102, FIG. 3C is a plan view of the wiring layer 103, and FIG. 3D is a plan view of the wiring layer 104. Cross-sections taken along line A-A' in FIGS. 3A through 3D form FIG. 2A. The surface wiring pattern 14 is formed in the wiring layer 101 as illustrated in FIG. 3A, and the electrode pads 12 are formed in the wiring layer 104 as illustrated in FIG. 3D. Moreover, the wiring patterns 16a and 16b that are a part of the inductor 80 are formed in the wiring layers 102 and 103 respectively. The wiring patterns 16a and 16b and the via wirings 18 connecting the wiring patterns (16a, 16b) form the inductor 80 illustrated in FIG. 2B. Other wiring patterns are filled with black, and a detailed description thereof is omitted.

Figure 4:
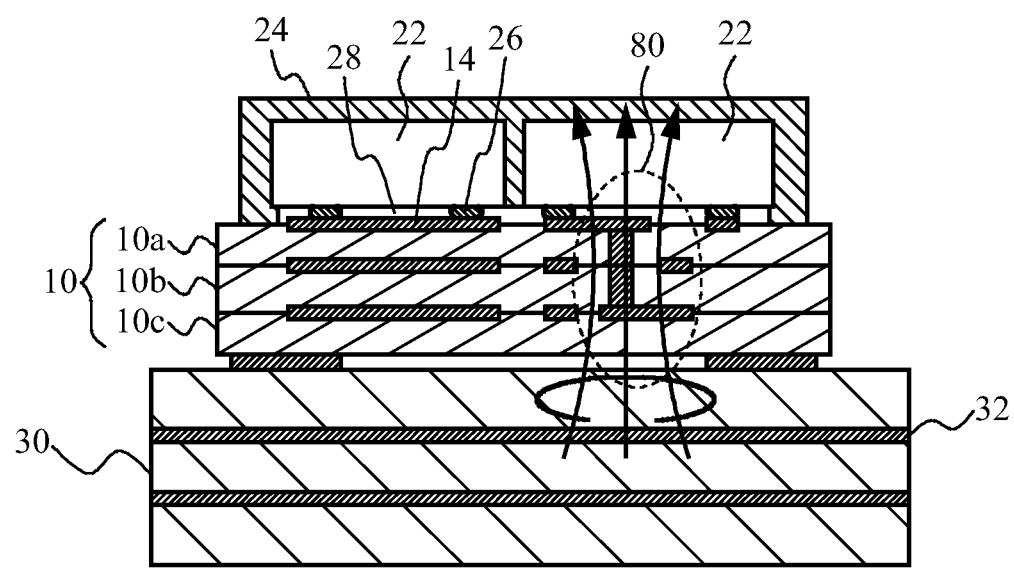
FIG. 4 is a diagram illustrating the acoustic wave device of the comparative example mounted on a large-size substrate.

FIG. 4 is a schematic cross-sectional view illustrating the multilayered substrate 10 mounted on the large-size substrate 30. As with the multilayered substrate 10, a metal pattern 32 is formed in the large-size substrate 30. In this case, the direction of the magnetic flux of the inductor 80 is a direction passing through the multilayered substrate 10 and the large-size substrate 30, and thus a part of the magnetic flux is shielded by the metal pattern 32 of the large-size substrate 30, and an inductance of the inductor 80 changes.

The comparative example configures the inductor 80 to be located below the transmission filter chip 20, and thus the magnetic flux generated by the inductor 80 passes through the transmission filter chip 20. Thus, the magnetic flux generated by the inductor 80 affects the characteristic of the transmission filter formed in the transmission filter chip 20. For example, when the acoustic wave device is mounted on the large-size substrate 30 and thereby the magnetic flux of the inductor 80 changes, the filter characteristic of the transmission filter also changes.

Further, a surface of a functional element of the acoustic wave device is not covered with resin in order not to prevent acoustic vibrations in the acoustic wave device. Thus, in the comparative example, the surface of the transmission filter chip 20 at the multilayered substrate 10 side is not covered with resin, and is exposed to the air-space 28. Thereby, the magnetic flux of the inductor 80 can pass into the transmission filter chip 20 without being weakened by resin, and affects the filter characteristic more than a case where resin is present.

The following embodiments will describe acoustic wave devices capable of reducing an effect of magnetic flux generated by an inductor formed in a multilayered substrate and preventing degradation of a filter characteristic.

First Embodiment

Figure 5A:
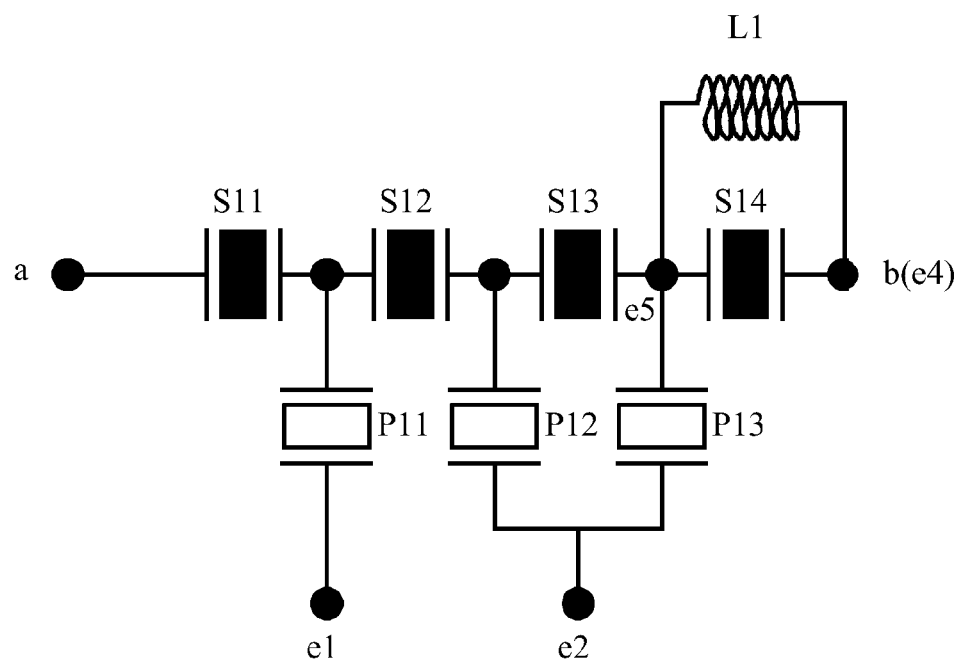
FIGS. 5A and 5B are diagrams illustrating a configuration of a transmission filter of an acoustic wave device of a first embodiment.
Figure 5B:
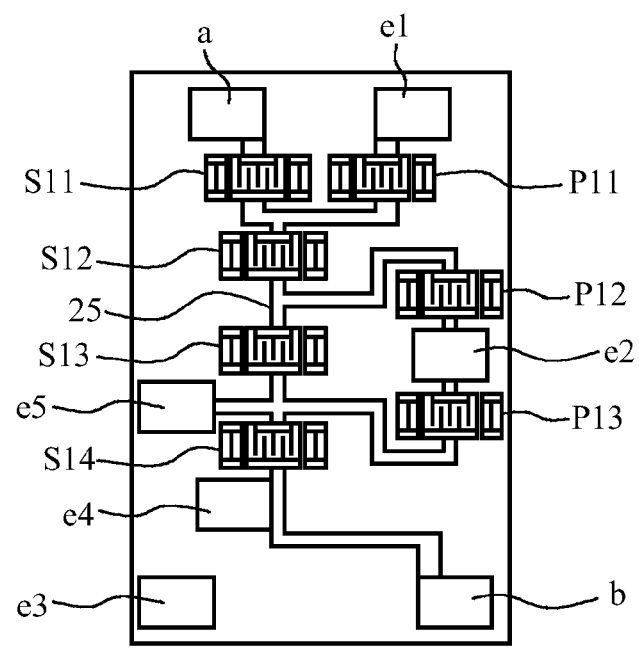

FIG. 5A is a circuit diagram illustrating a configuration of a transmission filter formed in the transmission filter chip 20, and FIG. 5B is a top schematic view illustrating a tangible layout of FIG. 5A. As illustrated in FIG. 5A, the transmission filter includes four series resonators S11 through S14 connected in series between input and output terminals (a, b). An inductor L1 is connected in parallel to the series resonator S14 connected to the terminal b out of the series resonators S11 through S14. A first end of a parallel resonator P11 is connected between the series resonators S11 and S12, a first end of a parallel resonator P12 is connected between the series resonators S12 and S13, and a first end of a parallel resonator P13 is connected between the series resonators S13 and S14. A second end of the parallel resonator P11 is grounded alone, and second ends of the parallel resonators P12 and P13 are unified and then grounded.

As illustrated in FIG. 5B, the series resonators S11 through S14 and the parallel resonators P11 through P13 are configured as surface acoustic wave (SAW) resonators, each including a pair of comb-shaped electrodes facing each other and a pair of reflection electrodes located at both sides of the pair of comb-shaped electrodes. The resonators are electrically coupled to each other by wiring patterns 25. Electrode pads (a, b, e1 through e5) located in the wiring patterns 25 correspond to nodes (a, b, e1 through e5) in FIG. 5A, respectively.

Figure 6A:
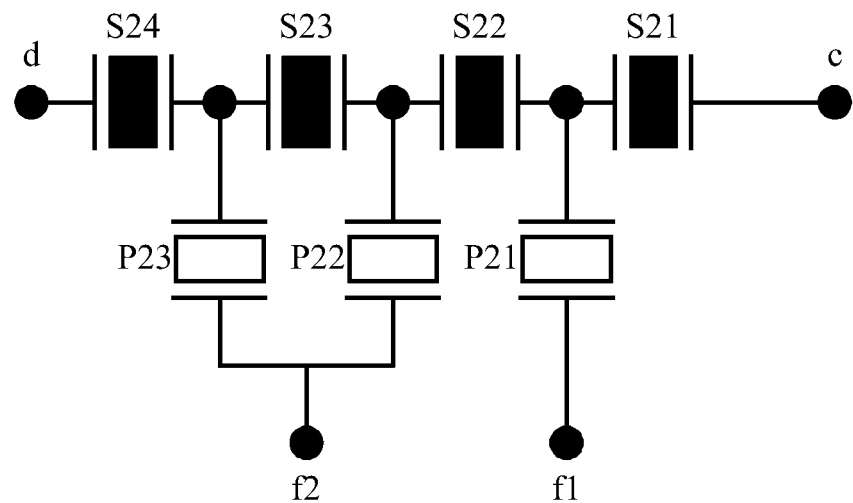
FIGS. 6A and 6B are diagrams illustrating a configuration of a reception filter of the acoustic wave device of the first embodiment.
Figure 6B:
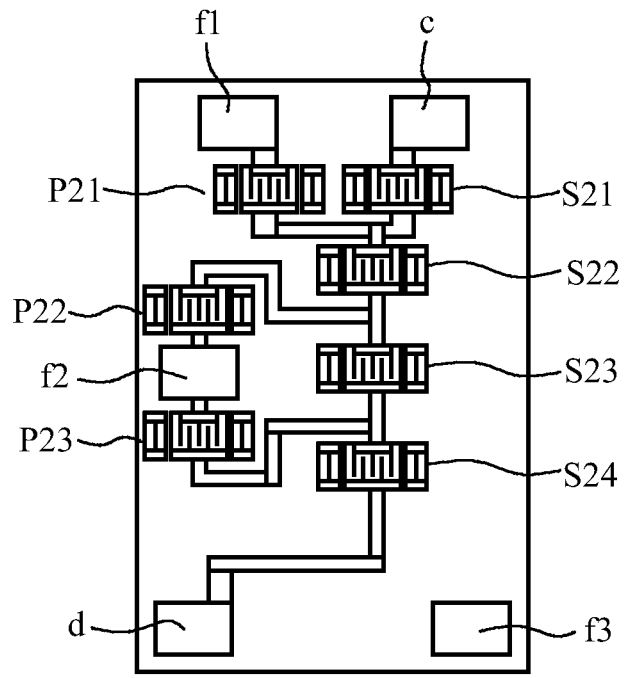

FIG. 6A is a circuit diagram illustrating a configuration of a reception filter formed in the reception filter chip 22, and FIG. 6B is a top schematic view illustrating a tangible layout of FIG. 6A. As illustrated in FIG. 6A, a reception filter includes four series resonators S21 through S24 connected in series between input and output terminals (c, d). A first end of a parallel resonator P21 is connected between the series resonators S21 and S22, a first end of a parallel resonator P22 is connected between the series resonators S22 and S23, and a first end of a parallel resonator P23 is connected between series resonators S23 and S24. A second end of the parallel resonator P21 is grounded alone, and second ends of the parallel resonators P22 and P23 are unified and then grounded.

As illustrated in FIG. 6B, the series resonators S21 through S24 and the parallel resonators P21 through P23 are configured as the surface acoustic wave (SAW) resonators same as those described in FIG. 5B. The resonators are electrically coupled to each other by the wiring patterns 25. Electrode pads (c, d, f1 through f3) located in the wiring patterns 25 correspond to nodes (c, d, f1 through f3) in FIG. 6A, respectively.

Figure 7A:
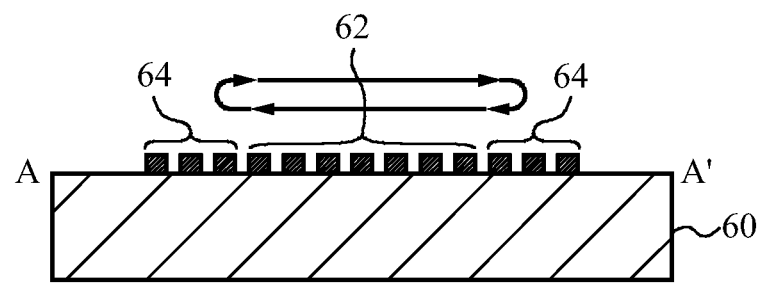
FIGS. 7A and 7B are diagrams illustrating a structure of a surface acoustic wave resonator.
Figure 7B:
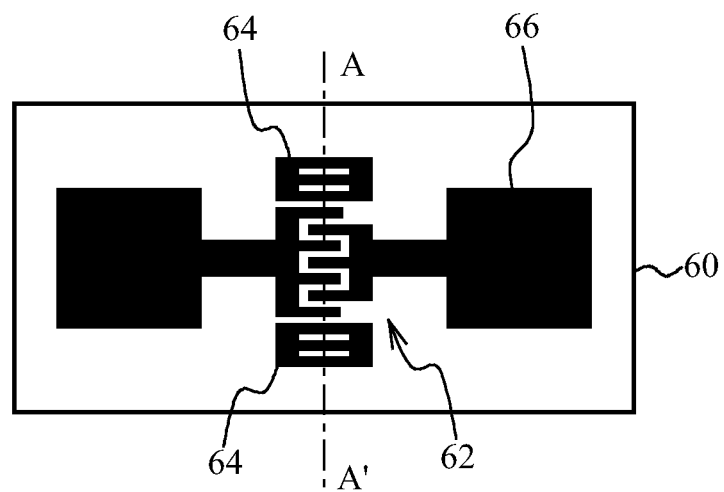

FIG. 7A is a schematic cross-sectional view of the surface acoustic wave resonators illustrated in FIG. 5B and FIG. 6B, and FIG. 7B is a top schematic view corresponding to FIG. 7A (FIG. 7A is a cross sectional view taken along line A-A' in FIG. 7B). As illustrated in FIG. 7A and FIG. 7B, on a piezoelectric substrate 60, formed are comb-shaped electrodes 62, reflection electrodes 64, and electrode pads 66 coupled to the comb-shaped electrodes 62. The comb-shaped electrodes 62 and the reflection electrodes 64 are arranged along a propagation direction of a surface acoustic wave (direction indicated with an arrow). The present embodiment uses a SAW resonator for the series resonators S11 through S24 and the parallel resonators P21 through P23, but may use a piezoelectric thin film resonator (BAW resonator) illustrated in FIGS. 8A and 8B instead of the SAW resonator.

Figure 8A:
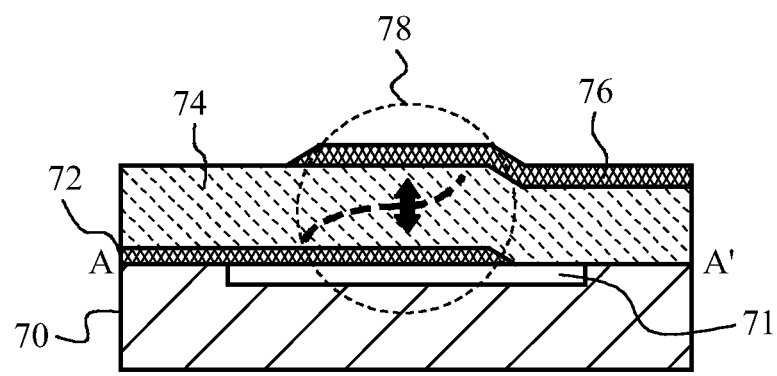
FIGS. 8A and 8B are diagrams illustrating a structure of a piezoelectric thin film resonator.
Figure 8B:
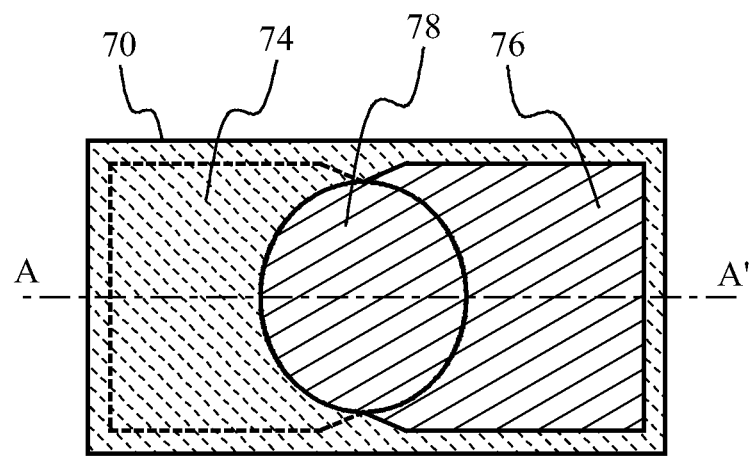

FIG. 8A is a schematic cross-sectional view of a piezoelectric thin film resonator, and FIG. 8B is a top schematic view corresponding to FIG. 8A (FIG. 8A is a cross-sectional view taken along line A-A' in FIG. 8B). As illustrated in FIG. 8A, a lower electrode 72, a piezoelectric film 74, and an upper electrode 76 are stacked on a support substrate 70 including an air-space 71 with a recess shape formed in a surface thereof. A resonance region 78 in which the lower electrode 72 and the upper electrode 76 face each other across the piezoelectric film 74 is located above the air-space 71, and is a functional element in the piezoelectric thin film resonator.

Other structures may be employed for the piezoelectric thin film resonator instead of the structure illustrated in FIGS. 8A and 8B. For example, a dome-shaped air space may be formed by forming a lower electrode a part of which curves on a surface of a flat support substrate instead of the air-space 71 with a recess shape formed in the surface of the support substrate 70. Or, instead of the air-space 71, two types of acoustic reflection films with a given thickness may be alternately stacked. In addition, the air-space 71 in FIGS. 8A and 8B does not pierces the support substrate 70, but the air-space 71 may pierce the support substrate 70, and the lower electrode 72 may be exposed to the back surface of the support substrate 70.

Figure 9A:
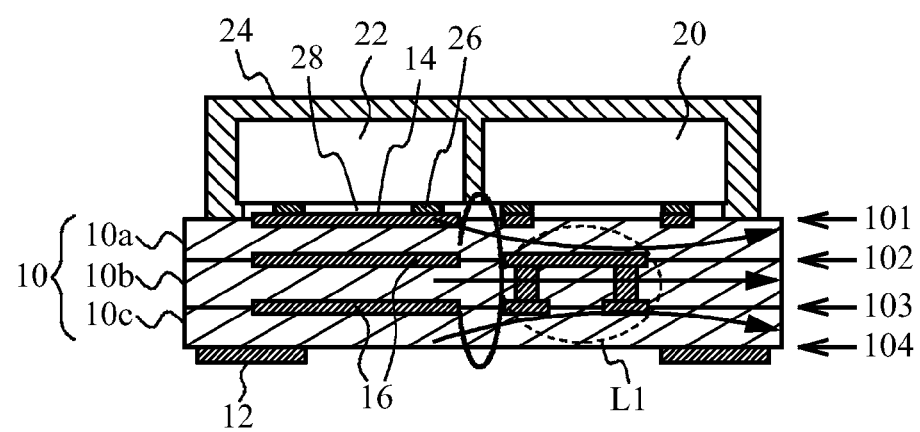
FIGS. 9A and 9B are diagrams illustrating a structure of the acoustic wave device of the first embodiment.
Figure 9B:
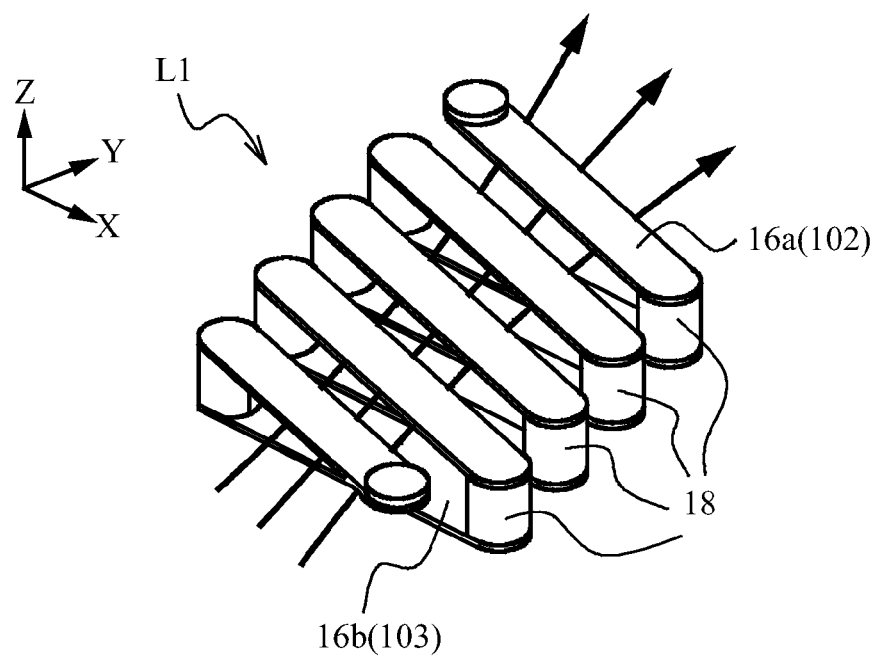

FIGS. 9A and 9B are diagrams illustrating a detailed structure of the acoustic wave device in accordance with the first embodiment, FIG. 9A is a schematic cross-sectional view, and FIG. 9B is a schematic perspective view of an inductor part. As illustrated in FIG. 9A, the acoustic wave device of the first embodiment includes the transmission filter chip 20 and reception filter chip 22 flip-chip mounted on the surface of the multilayered substrate 10 formed by stacking the substrates 10a through 10c. As with the comparative example, the multilayered substrate 10 includes the wiring layers 101 through 104, the surface wiring pattern 14 is formed in the wiring layer 101 on the front surface, the electrode pads 12 are formed in the wiring layer 104 on the back surface, and the internal wiring patterns 16 are formed in the internal wiring layers 102 and 103.

As illustrated in FIG. 9A, the reception filter chip 22 and the transmission filter chip 20 are flip-chip mounted on the surface wiring pattern 14 through the bumps 26, and electrically coupled to the internal wiring patterns 16 of the multilayered substrate 10 and the electrode pads 12. The upper surfaces and side surfaces of the reception filter chip 22 and the transmission filter chip 20 are covered with the resin 24, but bottom surfaces are exposed to the air-space 28 located between the multilayered substrate 10 and the chips.

As illustrated in FIG. 9A, as with the comparative example, the acoustic wave device of the first embodiment includes an inductor L1 formed by parts of the internal wiring patterns 16. However, a direction of magnetic flux in the inductor L1 differs from that of the comparative example, and is an intersecting direction with respect to the stacking direction of the multilayered substrate 10. Here, "a direction of magnetic flux" means a direction of magnetic flux passing through the inductor L1. In addition, "an intersecting direction (with respect to the stacking direction of the multilayered substrate 10)" means a horizontal direction with respect to the substrates 10a through 10c constituting the multilayered substrate 10. As illustrated in FIG. 9B, the stacking direction of the substrate is a Z-axis direction, but the direction of the magnetic flux passing through the inside of the inductor L1 nearly coincides with a Y-axis direction, and is along an X-Y plane (plane parallel to the surface of the substrate).

Figure 10A:
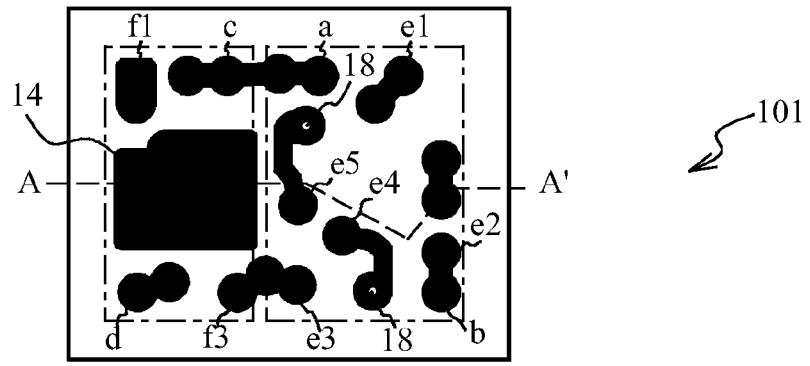
FIGS. 10A through 10D are plan views of wiring layers of the acoustic wave device of the first embodiment.
Figure 10B:
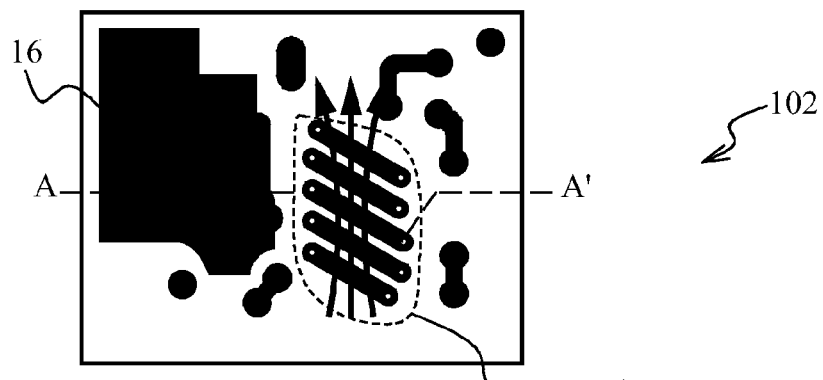
Figure 10C:
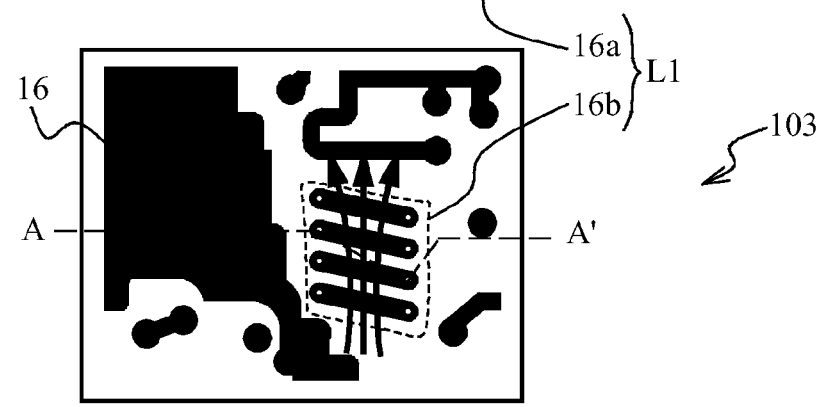
Figure 10D:
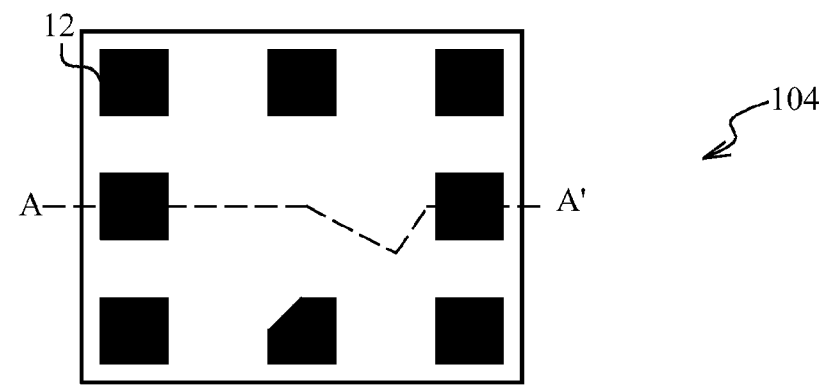

FIGS. 10A through 10D are plan views of wiring layers transparently illustrating the acoustic wave device of the first embodiment from the upper surface side (side on which the filter chip is mounted) of the multilayered substrate 10. FIG. 10A is a plan view of the wiring layer 101, FIG. 10B is a plan view of the wiring layer 102, FIG. 10C is a plan view of the wiring layer 103, and FIG. 10D are plan view of the wiring layer 104. Cross-sections taken along line A-A' in FIGS. 10A through 10D form FIG. 9A. The surface wiring pattern 14 is formed in the wiring layer 101 as illustrated in FIG. 10A, and the electrode pads 12 are formed in the wiring layer 104. In addition, the wiring patterns 16a and 16b of the inductor are formed in the wiring layers 102 and 103 respectively. Other wiring patterns are filled with black. Reference numerals (a, b, c, d, e1 through e5, f1 through f3) affixed to the wiring patterns correspond to the node (a, b, c, d, e1 through e5, f1 through f3) illustrated in FIG. 5B and FIG. 6B.

As illustrated in FIG. 10B, the stick-shaped wiring patterns 16a (first wiring) are parallel formed in the wiring layer 102. The stick-shaped wiring patterns 16b (second wiring) are parallel formed in the wiring layer 103. The wiring patterns 16a and 16b are formed in positions in which end portions thereof overlap each other in the stacking direction of the multilayered substrate 10, and the end portions are coupled by the via wirings 18. The via wiring 18 is formed by filing up a penetration hole piercing the substrate 10b with metal, and electrically connects the wiring patterns in the wiring layers 102 and 103. The wiring patterns (16a, 16b) and the via wirings 18 form an inductor with a multiple-loop shape illustrated in FIG. 9B.

Figure 11:
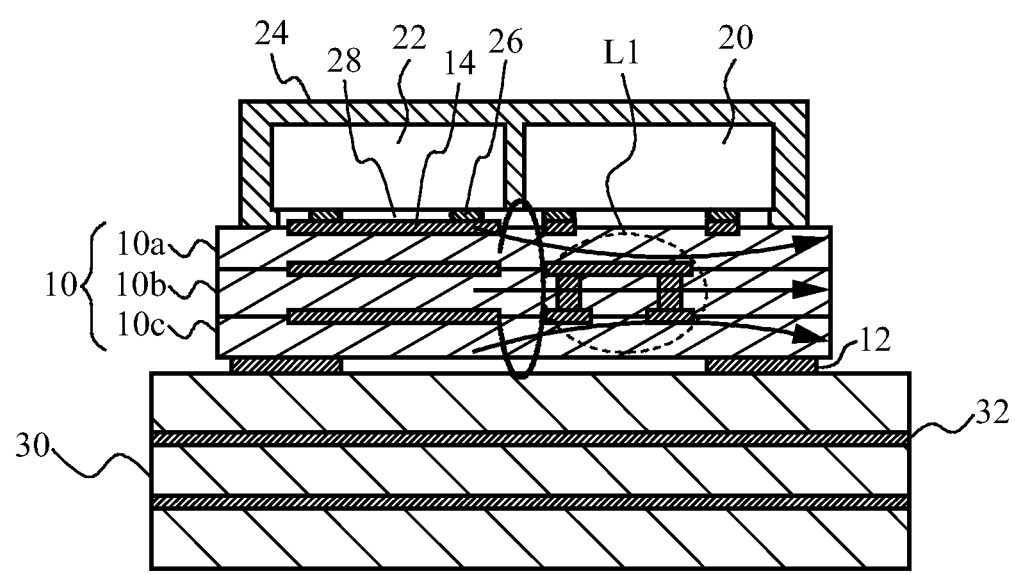
FIG. 11 is a diagram illustrating the acoustic wave device of the first embodiment mounted on a large-size substrate.

FIG. 11 is a schematic cross-sectional view illustrating the acoustic wave device of the first embodiment mounted on the large-size substrate 30. As with the multilayered substrate 10, the large-size substrate 30 includes the metal pattern 32 formed therein. In this case, the direction of the magnetic flux of the inductor L1 in the multilayered substrate 10 is along the surfaces of the multilayered substrate 10 and the large-size substrate 30, and thus is not easily affected by the metal pattern 32 of the large-size substrate 30. Thereby, the degradation of the filter characteristic can be suppressed.

Figure 12A:
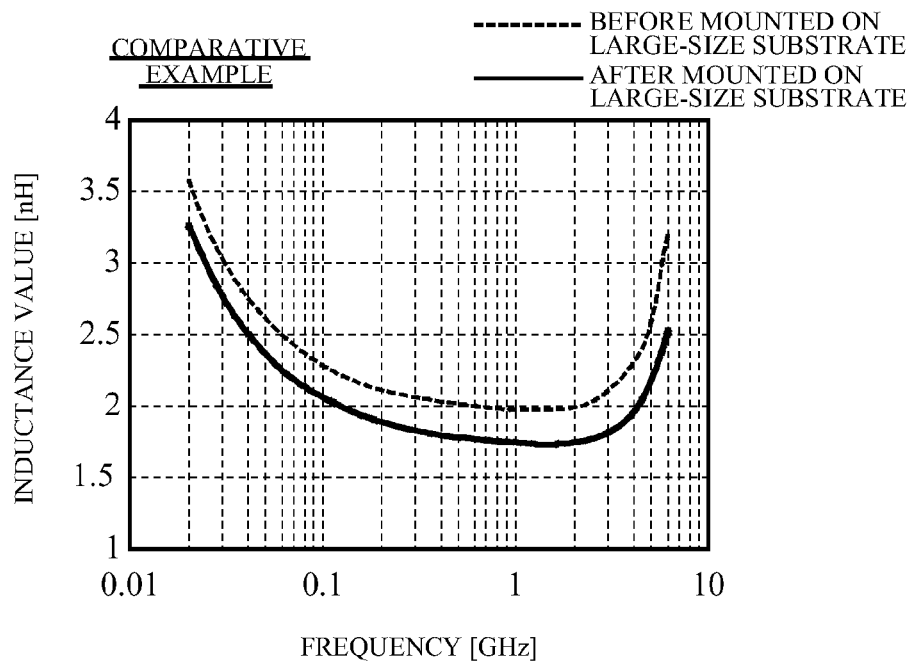
FIGS. 12A and 12B illustrate simulation results of change in inductance values.
Figure 12B:
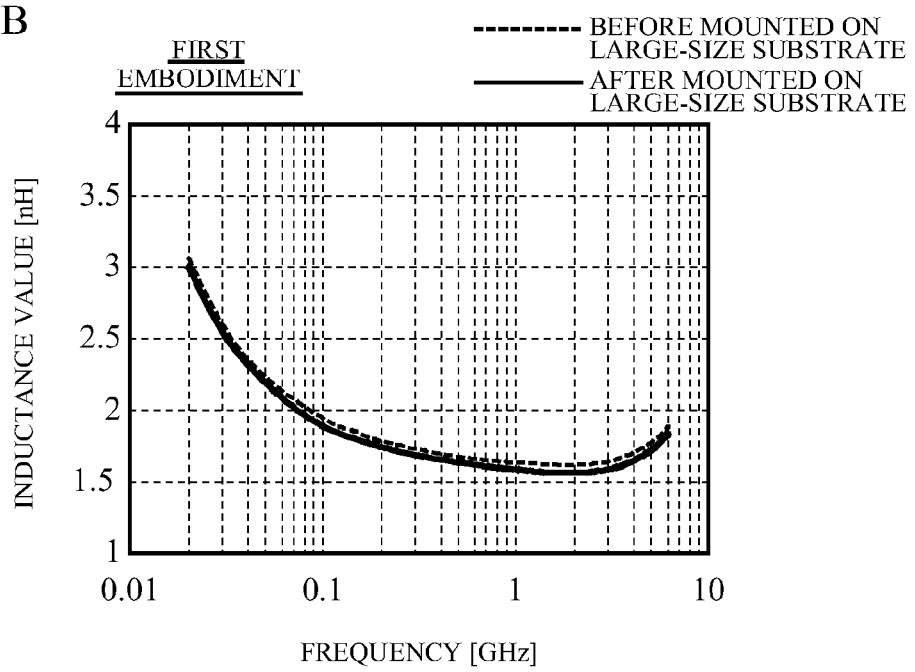

FIGS. 12A and 12B illustrate simulation results of change in inductance values when the acoustic wave device (multilayered substrate, reception filter chip, transmission filter chip) is mounted on a large-size substrate. FIG. 12A presents results of the comparative example, and FIG. 12B presents results of the first embodiment. Dotted lines represent inductance values before mounted, and solid lines represent inductance values after mounted. As illustrated in FIG. 12A, the inductance value greatly decreases when the acoustic wave device is mounted on the large-size substrate in the comparative example (the direction of the magnetic flux of the inductor is the same as the stacking layer of the substrate). In contrast, as illustrated in FIG. 12B, the inductance value does not greatly change before and after the acoustic wave device is mounted on the large-size substrate 30 in the first embodiment (the direction of magnetic flux is perpendicular to the stacking direction of the substrate).

As described above, the acoustic wave device of the first embodiment configures the direction of the magnetic flux of the inductor L1 formed inside the multilayered substrate 10 to be an intersecting direction with respect to the stacking direction of the substrate. This configuration can drastically reduce the magnetic flux, out of the magnetic flux generated by the inductor L1, passing through the filter chip (20, 22) and thus can reduce the effect of the magnetic flux on the filter characteristic. Moreover, this configuration can drastically reduce the magnetic flux, out of the magnetic flux generated by the inductor L1, shielded by the metal pattern 32 of the large-size substrate 30 on which the acoustic wave device is mounted. Thus, the effect of the metal pattern 32 of the large-size substrate 30 on the inductance of the inductor L1 can be reduced.

The configuration of the acoustic wave device of the first embodiment is especially preferable when acoustic wave filter chips (20, 22) are mounted on the surface of the multilayered substrate 10 and the multilayered substrate 10-side surfaces of the chips are not covered with the resin 24. As described previously, the surface of the functional element is preferably not covered with the resin 24 in order not to prevent the acoustic vibrations. Thus, the magnetic flux from the inductor formed in the multilayered substrate 10 passes into the filter chips (20, 22) without being weakened by the resin 24, and thus affects the filter characteristic more than a case where the resin 24 is present. However, the first embodiment configures the direction of the magnetic flux of the inductor L1 to intersect with the stacking direction of the multilayered substrate 10, and prevents the magnetic flux from passing into the filter chips (20, 22). Therefore, even when the surfaces of the filter chips (20, 22) are not covered with the resin 24, the effect of the inductor formed in the multilayered substrate on the filter characteristic can be reduced.

In the first embodiment, the inductor L1 is formed by combining the stick-shaped wiring patterns (16a, 16b) formed in the internal wiring layers (102, 103) of the multilayered substrate 10 and the via wirings 18. However, the structure of the inductor L1 is not limited to the tangible structure described in the first embodiment, and may be any of which the direction of the magnetic flux is an intersecting direction with respect to the stacking direction of the multilayered substrate 10.

Second Embodiment

A second embodiment forms two different inductors.

Figure 13A:
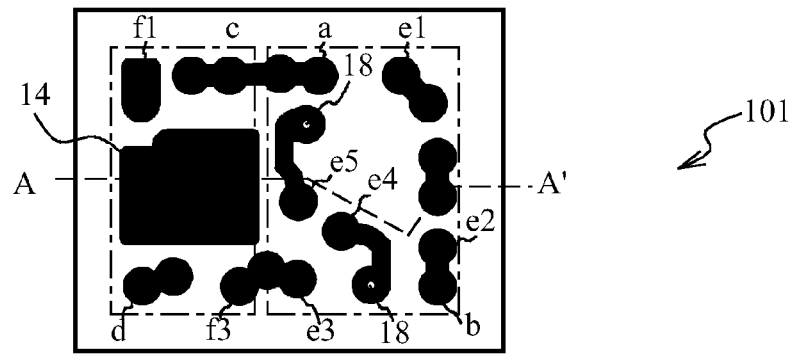
FIGS. 13A through 13D are plan views of wiring layers of an acoustic wave device in accordance with a second embodiment.
Figure 13B:
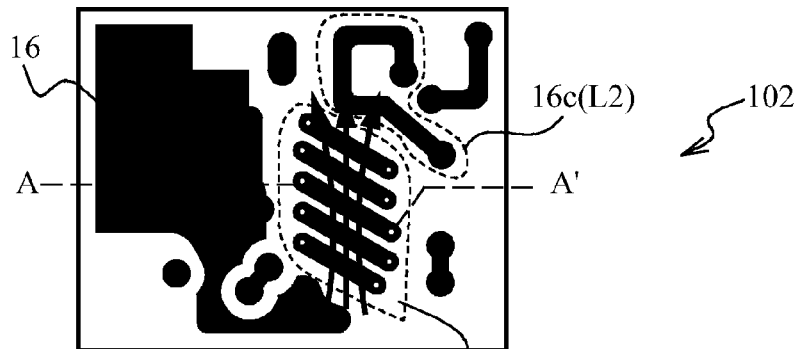
Figure 13C:
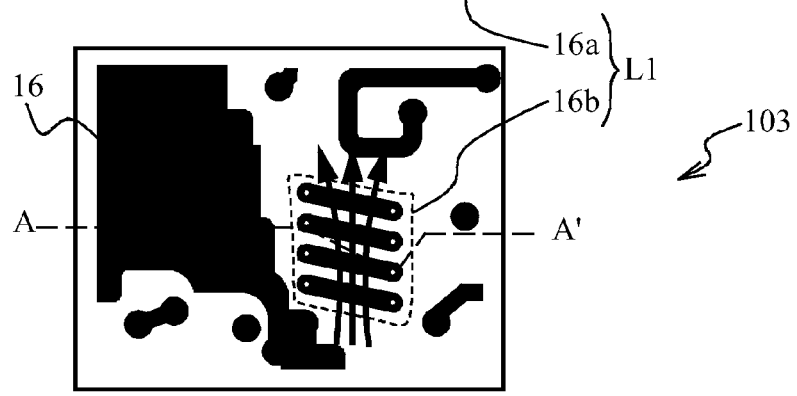
Figure 13D:
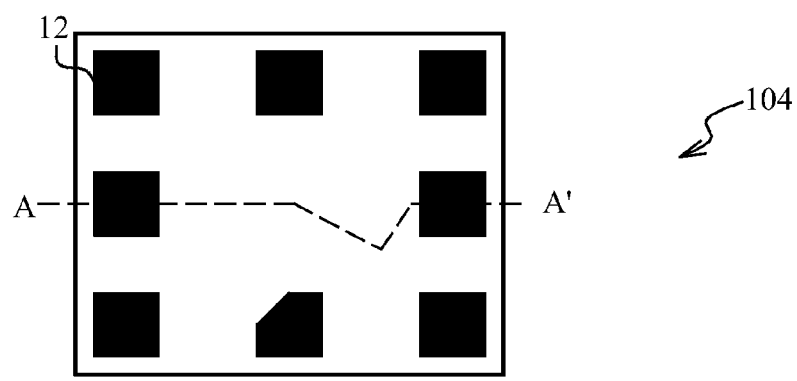

FIGS. 13A through 13D are plan views of wiring layers transparently illustrating an acoustic wave device of the second embodiment from the upper surface side (side on which a filter chip is mounted) of the multilayered substrate 10, and correspond to FIGS. 10A through 10D. The surface wiring pattern 14 is formed in the wiring layer 101 as illustrated in FIG. 13A, and the electrode pads 12 are formed in the wiring layer 104 as illustrated in FIG. 13D. The wiring patterns 16a, 16b, and 16c of inductors are formed in the wiring layers 102 and 103. A detailed description of other wiring patterns is omitted. Reference numerals (a, b, c, d, e1 through e5, f1 through f3) affixed to the wiring patterns correspond to the nodes (a, b, c, d, e1 through e5, f1 through f3) in FIG. 5B and FIG. 6B respectively.

As illustrated in FIGS. 13B and 13C, the inductor L1 is formed by the stick-shaped wiring patterns (16a, 16b) formed in the internal wiring layers (102, 103) and the via wirings 18 in the same manner as that of the first embodiment. The inductor L1 is the inductor connected in parallel to the series resonator S14 illustrated in FIG. 5A (hereinafter, described as a "first inductor L1"). As illustrated in FIG. 11B, a second inductor L2 separate from the first inductor L1 is formed by a spiral-shaped wiring pattern 16c (third wiring). The second inductor L2 is an inductor connected to the node e2 in FIG. 5A (not illustrated in FIG. 5A), and the direction of the magnetic flux thereof is the same as the stacking direction of the multilayered substrate 10 as that of the inductor of the comparative example is.

When two inductors are formed inside the multilayered substrate 10, the acoustic wave device of the second embodiment can reduce the effect of change in magnetic flux on the filter characteristic by configuring one of the two inductors to be the first inductor L1 (of which the direction of the magnetic flux intersects with the stacking direction of the multilayered substrate). In addition, the direction of the magnetic flux of the second inductor L2 is configured to be the same as the stacking direction of the multilayered substrate 10, and thereby the interference between two inductors can be suppressed because the vector of the magnetic flux of the first inductor L1 nearly perpendicularly intersects with the vector of the magnetic flux of the second inductor L2.

FIGS. 14A through 14D are diagrams illustrating a configuration of an acoustic wave device in accordance with a variation of the second embodiment. Same numeral references are affixed to structures in common with those in FIGS. 13A through 13D, and a detailed description will be omitted. The acoustic wave device of the variation is the same as that of the second embodiment in that the first inductor L1 is formed in the wiring layers 102 and 103 inside the multilayered substrate 10 (FIGS. 13A and 13B), but differs in that the wiring pattern 16c of the second inductor L2 is formed in the wiring layer 101 on the front surface.

Figure 14A:
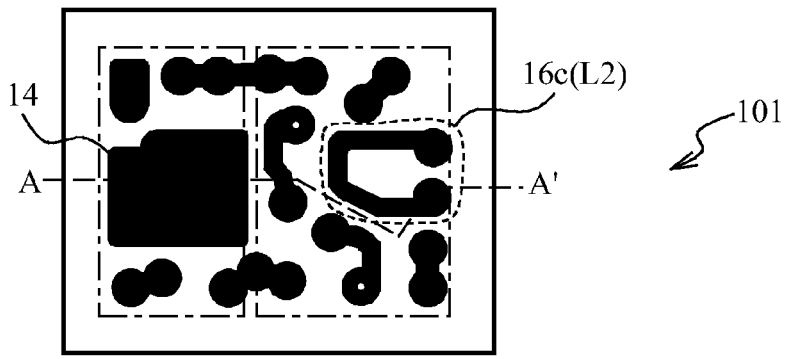
FIGS. 14A through 14D are plan views of wiring layers of an acoustic wave device in accordance with a variation of the second embodiment.
Figure 14B:
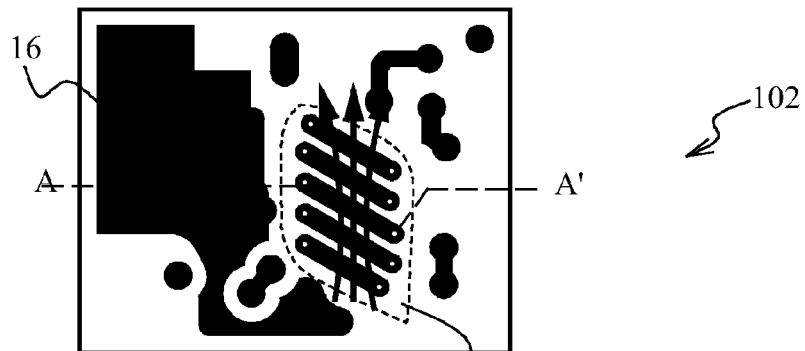
Figure 14C:
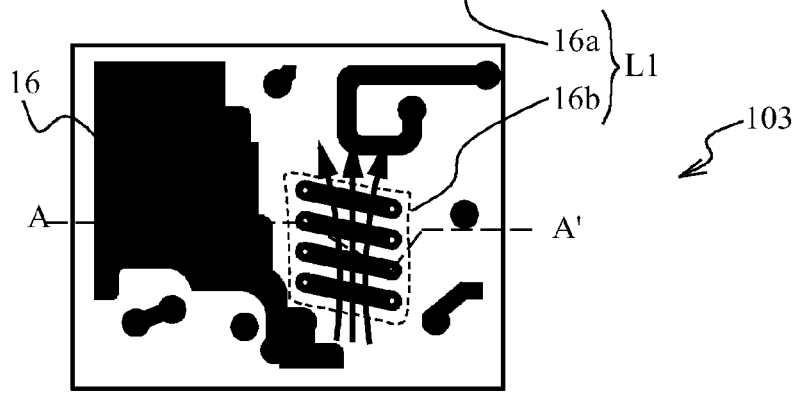
Figure 14D:
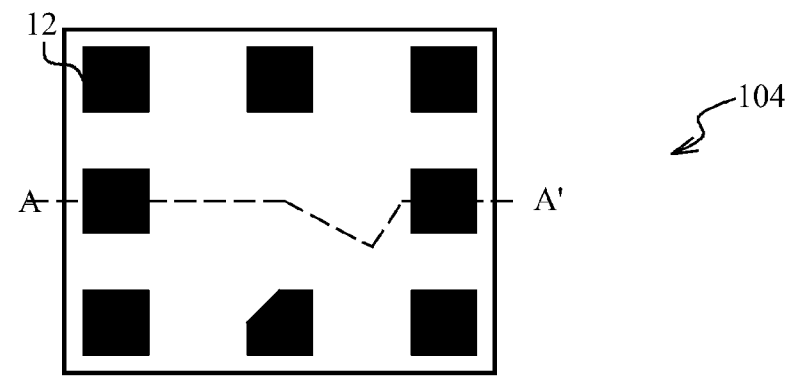

When the acoustic wave device is mounted on the large-size substrate 30 as illustrated in FIG. 11 of the first embodiment, the second inductor L2, of which the direction of the magnetic flux is the same as the stacking direction of the multilayered substrate 10, is preferably formed in a position away from the large-size substrate 30. This allows the magnetic flux of the second inductor L2 to be less shielded by the metal pattern 32 of the large-size substrate 30, and can reduce the effect of change in magnetic flux on the filter characteristic. Therefore, the second inductor L2 is preferably formed in the wiring layer 101 on the front surface which is located farthest from the large-size substrate 30 as illustrated in FIG. 14A, but the same effect can be expected when it is formed in a layer closer to the front surface than the layer in which the first inductor L1 is formed (layer closer to the transmission filter chip 20 and the reception filter chip 22). In addition, in the large-size substrate on which the acoustic wave device is mounted, the metal pattern 32 is preferably not formed immediately below the second inductor L2 (region overlapping the second inductor L2 in the stacking direction of the multilayered substrate 10). This can further reduce the change in magnetic flux in the second inductor L2.

When the second inductor L2 is formed so as to include at least the same wiring layer that forms the first inductor L1 as described in the second embodiment (FIGS. 13A through 13D), interference of the magnetic flux between the first inductor L1 and the second inductor L2 can be greatly reduced. On the other hand, when the second inductor L2 is formed so as to include a wiring layer different from the wiring layer that forms the first inductor L1 as described in the variation of the second embodiment (FIGS. 14A through 14D), the change in magnetic flux in the second inductor L2 can be reduced. Further, as illustrated in FIGS. 14A through 14D, an area of the substrate needed for forming an inductor can be reduced and the device can be downsized by forming the first inductor L1 and the second inductor L2 in a position where they overlap each other in the stacking direction of the multilayered substrate 10.

The first and second embodiments use a resonator using a surface acoustic wave (SAW) (FIGS. 7A and 7B) or a piezoelectric thin film resonator using a bulk wave (FBAR, FIGS. 8A and 8B) as the acoustic wave device. Both of them are an acoustic wave device having a vibration part. An acoustic wave device using a Love wave, a boundary wave, or a Lamb wave may be used as the acoustic wave device.

Although the embodiments of the present invention have been described in detail, it is to be understood that the various change, substitutions, and alterations could be made hereto without departing from the spirit and scope of the invention.

What is claimed is:

1. An acoustic wave device comprising:
an acoustic wave filter chip that is mounted on a multilayered substrate including wiring layers;
a first wiring that is electrically coupled to an internal circuit of the acoustic wave filter chip and formed in a first wiring layer of the multilayered substrate;
a second wiring that is formed in a second wiring layer separate from the first wiring layer; and
a via wiring that penetrates at least a part of the multilayered substrate and connects the first wiring to the second wiring; wherein
the first wiring, the second wiring, and the via wiring forms a first inductor of which a direction of magnetic flux extends along a planar direction of a surface of the multilayered substrate.

2. The acoustic wave device according to claim 1, wherein a surface of the acoustic wave filter chip that faces the multilayered substrate is exposed to an air-space between the acoustic wave filter chip and the multilayered substrate.

3. The acoustic wave device according to claim 1, wherein the first wiring includes first conductive patterns with a straight line shape formed mutually parallel,
the second wiring includes second conductive patterns with a straight line shape formed mutually parallel,
the first conductive patterns and the second conductive patterns are formed in positions in which end portions thereof overlap each other in the stacking direction of the multilayered substrate, and
the end portions are connected with each other by a plurality of the via wirings.

4. The acoustic wave device according to claim 1, further comprising:
a third wiring that is formed in at least one or more wiring layers in the multilayered substrate and forms a second inductor of which a direction of magnetic flux is along a stacking direction of the multilayered substrate.

5. The acoustic wave device according to claim 4, wherein the second inductor is formed so as to include at least one of the first wiring layer and the second wiring layer.

6. The acoustic wave device according to claim 4, wherein the second inductor is formed so as to include a wiring layer other than the first wiring layer and the second wiring layer.

7. The acoustic wave device according to claim 6, wherein the second inductor is formed in a wiring layer closer to the acoustic wave filter chip than a wiring layer in which the first inductor is formed.

8. The acoustic wave device according to claim 6, wherein the first inductor and the second inductor are formed in a position in which the first inductor and the second inductor overlap each other in the stacking direction of the multilayered substrate.

9. The acoustic wave device according to claim 3, wherein, one end position of one of the first conductive patterns overlaps one end position of one of the second conductive patterns and is connected to the one end position of the one of the second conductive patterns via a first via wiring of the via wirings,
the other end position of the one of the first conductive patterns overlaps one end position of another one of the second conductive patterns adjacent to the one of the second conductive pattern and is connected to the one end position of the another one of the second conductive patterns via a second via wiring of the via wirings,
the other end position of the one of the second conductive patterns overlaps one end position of another one of the first conductive patterns adjacent to the one of the first conductive pattern and is connected to the one end position of the another one of the first conductive patterns via a third via wiring of the via wirings.

* * * * *